US012793652B2

(12) United States Patent
Jeong et al.

(10) Patent No.: US 12,793,652 B2
(45) Date of Patent: Nov. 10, 2026

(54) DISPLAY DEVICE

(71) Applicant: LG Display Co., Ltd., Seoul (KR)

(72) Inventors: Youngmin Jeong, Paju-si (KR); Wonho Lee, Paju-si (KR); Byungsam Min, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/270,294

(22) Filed: Jul. 15, 2025

(65) Prior Publication Data

US 2026/0188242 A1 Jul. 2, 2026

(30) Foreign Application Priority Data

Dec. 27, 2024 (KR) ........................ 10-2024-0198034

(51) Int. Cl.
*G09G 3/3266* (2016.01)
*H10K 59/131* (2023.01)
*G09G 3/3233* (2016.01)

(52) U.S. Cl.
CPC ......... *G09G 3/3266* (2013.01); *H10K 59/131* (2023.02); *G09G 3/3233* (2013.01); *G09G 2310/0286* (2013.01); *G09G 2320/0233* (2013.01)

(58) Field of Classification Search
None
See application file for complete search history.

(56) References Cited

U.S. PATENT DOCUMENTS

2005/0275614 A1* 12/2005 Kim ..................... G11C 19/184 345/100
2012/0169687 A1* 7/2012 Huang ................. G09G 3/3677 345/94

FOREIGN PATENT DOCUMENTS

KR 10-2024-0082703 A 6/2024

* cited by examiner

*Primary Examiner* — Krishna P Neupane
(74) *Attorney, Agent, or Firm* — Birch, Stewart, Kolasch & Birch, LLP

(57) ABSTRACT

A display device includes a plurality of stage circuits of a GIP driver circuit that are respectively connected to pixel lines via a plurality of scan lines. The plurality of scan lines are disposed in an area between the plurality of stage circuits and the horizontal pixel lines and are arranged such that at least two of the plurality of scan lines intersect each other. The arrangement of the plurality of scan lines is repeated every K horizontal pixel lines in the column direction. Thus, the display device copes with the high-speed operation and removes a front of screen (FOS) issue. In addition, charging rate and luminance degradation due to the high-speed operation is reduced.

10 Claims, 6 Drawing Sheets

DISPLAY DEVICE

CROSS-REFERENCE TO RELATED APPLICATION

The present application claims priority to Korean Patent Application No. 10-2024-0198034, filed in the Republic of Korea on Dec. 27, 2024, the entire contents of which is hereby expressly incorporated by reference into the present application.

BACKGROUND OF THE DISCLOSURE

Field

The present disclosure relates to a display device capable of coping with the high-speed operation of a display panel.

Description of the Related Art

An organic light-emitting display device is a self-emission display device. Unlike the liquid crystal display device, a separate light source is not required in the organic light-emitting display device. Thus, the organic light-emitting display device can be manufactured in a lightweight and thin manner. In addition, the organic light-emitting display device is advantageous in terms of power consumption due to low voltage operation, and has excellent color gamut, fast response speed, large viewing angle, and high contrast ratio (CR), and thus is being studied as a next-generation display.

Display devices are continuously being improved to increase the resolution and luminance of the screen to provide clear images to users.

SUMMARY OF THE DISCLOSURE

As application of the organic light-emitting display panel is extended to premium and gaming applications, the demand for high-speed operation as well as high resolution increases. However, issues can arise due to the charge rate and front of screen (FOS) mura in the high-speed operation. In order to improve the specification and secure the characteristics, the line thickness is increased or the line width is increased to reduce the line delay. However, this can decrease the aperture ratio of a light-emitting area.

Accordingly, the inventors of the present disclosure have invented an improved display device capable of coping with the high-speed operation of the display panel.

A purpose of the present disclosure is to provide a display device capable of coping with the high-speed operation of a display panel and removing an FOS issue.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims or combinations thereof.

In the display device according to an embodiment of the present disclosure, a gate in panel (GIP) driver circuit includes a plurality of stage circuits, and the plurality of stage circuits are respectively connected to the pixel lines via a plurality of scan lines, wherein the plurality of scan lines are disposed in an area between the plurality of stage circuits and the horizontal pixel lines and are arranged such that at least two of the plurality of scan lines intersect each other, wherein the arrangement of the plurality of scan lines is repeated every K horizontal pixel lines in the column direction.

In the display device according to an embodiment of the present disclosure, the plurality of scan lines include (n−1)-th, n-th, and (n+1)th scan lines sequentially arranged in the column direction, wherein in an area between the (n−1)-th and (n+1)th scan lines, the plurality of pixels are arranged in a staggered manner in the row direction such that odd-numbered pixels are disposed on one of both opposing sides in the column direction of the n-th scan line while even-numbered pixels are disposed on the other of both opposing sides in the column direction of the n-th scan line.

According to an embodiment of the present disclosure, in the display device, the connection structure in which at least two of the plurality of scan lines intersect each other in the area between the plurality of stage circuits and the plurality of horizontal pixel lines is repeated every K pixel horizontal lines in a column direction. Thus, the data transition between the horizontal pixel lines can be minimized or the data waveform can be based on the DC (direct current) even when the display device operates at high speed to display the row stripe patterns of white and black colors. Thus, the display device can cope with the high-speed operation, thereby removing the front of screen (FOS) issue.

In addition, in the display device according to aspects of the present disclosure, the connection structure in which at least two of the plurality of scan lines intersect each other in the area between the plurality of stage circuits and the plurality of horizontal pixel lines is repeated every K pixel horizontal lines in a column direction, thereby reducing the charging rate degradation and the luminance degradation due to the high-speed operation.

In addition, in the display device according to aspects of the present disclosure, the structure in which the pixels are arranged in the staggered manner in the row direction such that the odd-numbered pixels are disposed on one of both opposing sides in the column direction of the scan line while the even-numbered pixels are disposed on the other of both opposing sides in the column direction of the scan line can reduce the mura recognition.

In addition, the display device according to aspects of the present disclosure can operate at a high speed and the operation frequency can be increased, thereby increasing a product disclosure and realizing a premium product.

In addition, according to aspects of the present disclosure, even when the display device displays a measurement pattern capable of measuring the charging rate and luminance of the display panel, data transition between the horizontal pixel lines is minimized due to the structure in which the scan lines intersect each other, such that the charging rate and luminance degradation can be reduced.

In addition, according to aspects of the present disclosure, even when displaying the white and black row stripe patterns while operating at the high speed, the display device can minimize the data transition between the horizontal pixel lines and allows the data waveform to be based on the DC, thereby solving the mura issue and inhibiting the charging rate and luminance degradation.

Effects of the present disclosure are not limited to the effects mentioned above, and other effects not mentioned will be clearly understood by those skilled in the art from the description as set forth below.

In addition to the above effects, specific effects of the present disclosure are described together while describing specific details for carrying out the present disclosure.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
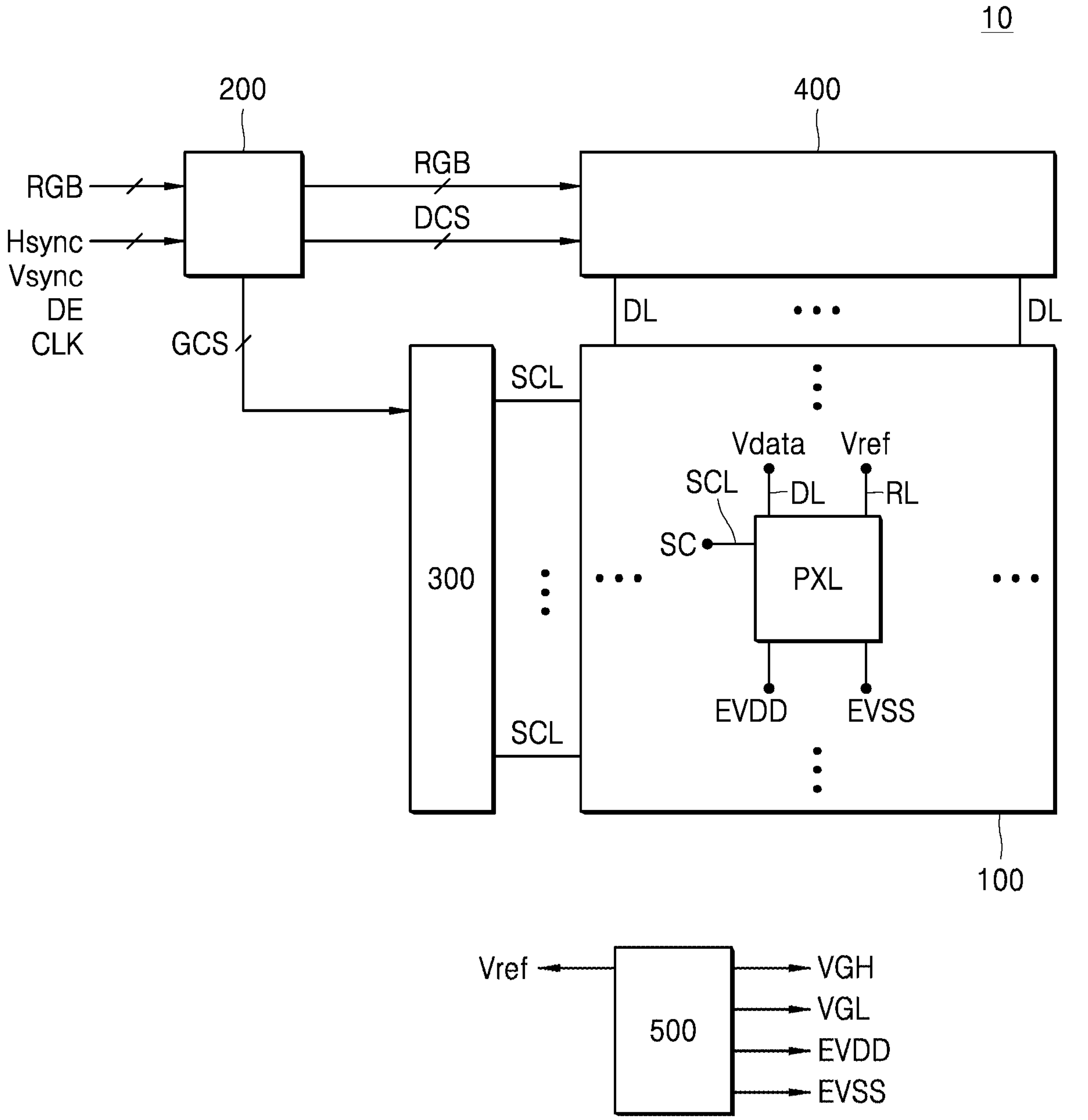
FIG. 1 is a block diagram illustrating an organic light-emitting display device according to embodiments of the present disclosure.

Advantages and features of the present disclosure, and a method of achieving the advantages and features will become apparent with reference to embodiments described below in detail together with the accompanying drawings. However, the present disclosure is not limited to the embodiments as disclosed under, but can be implemented in various different forms. Thus, these embodiments are set forth only to make the present disclosure complete, and to entirely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing various embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this disclosure, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items.

Expression such as "at least one of" when preceding a list of elements can modify an entirety of the list of elements and may not modify the individual elements of the list. In interpretation of numerical values, an error or tolerance therein can occur even when there is no explicit description thereof. In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when a first element or layer is referred to as being "connected to", or "coupled to" a second element or layer, the first element can be directly connected to or coupled to the second element or layer, or one or more intervening elements or layers can be present therebetween. In addition, it will also be understood that when an element or layer is referred to as being "between" two elements or layers, it can be the only element or layer between the two elements or layers, or one or more intervening elements or layers can also be present therebetween.

In descriptions of temporal relationships, for example, temporal precedent relationships between two events such as "after", "subsequent to", "before", etc., another event can occur therebetween unless "directly after", "directly subsequent" or "directly before" is not indicated. When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, areas, layers and/or periods, these elements, components, areas, layers and/or periods should not be limited by these terms. These terms are used to distinguish one element, component, area, layer or section from another element, component, area, layer or section. Thus, a first element, component, area, layer or section as described under could be termed a second element, component, area, layer or section, without departing from the spirit and scope of the present disclosure.

When an embodiment can be implemented differently, functions or operations specified within a specific block can be performed in a different order from an order specified in a flowchart. For example, two consecutive blocks can actually be performed substantially simultaneously, or the blocks can be performed in a reverse order depending on related functions or operations. The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms used in the description as set forth below have been selected as being general and universal in the related technical field. However, there can be other terms than the terms depending on the development and/or change of technology, convention, preference of technicians, etc. Therefore, the terms used in the description as set forth below should not be understood as limiting technical ideas, but should be understood as examples of the terms for illustrating embodiments. Further, in a specific case, a term can be arbitrarily selected by the applicant, and in this case, the detailed meaning thereof will be described in a corresponding description period. Therefore, the terms used in the description as set forth below should be understood based on not simply the name of the terms, but the meaning of the terms and the contents throughout the Detailed Description.

In description of flow of a signal, for example, when a signal is delivered from a node A to a node B, this can include a case where the signal is transferred from the node A to the node B via another node unless a phrase 'immediately transferred' or 'directly transferred' is used. Throughout the present disclosure, "A and/or B" means A, B, or A and B, unless otherwise specified, and "C to D" means C inclusive to D inclusive unless otherwise specified. Further, the term "can" fully encompasses all the meanings and coverages of the term "may" and vice versa.

Hereinafter, a display device that can cope with the high-speed operation and that can remove a FOS issue due to this configuration according to aspects of the present disclosure will be described.

Hereinafter, various embodiments of the disclosure will be described in detail with reference to the accompanying drawings. All the components of each display device according to all embodiments of the present disclosure are operatively coupled and configured.

FIG. 1 is a block diagram illustrating a display device according to embodiments of the inventive concept.

Referring to FIG. 1, a display device 10 includes a display panel 100 including a plurality of pixels PXL, a controller 200, a gate driver 300 configured to supply a scan signal SC to the plurality of pixels PXL, a data driver 400 configured to supply a data voltage Vdata to the plurality of pixels PXL, and a power supply 500 configured to supply voltages necessary for driving the plurality of pixels PXL thereto.

In the display panel 100, a plurality of scan lines SCL and a plurality of data lines DL intersect each other, and each of the plurality of pixels PXL is connected to the scan line SCL and the data line DL. Specifically, one pixel PXL receives the scan signal SC via the scan line SCL, receives the data voltage Vdata via the data line DL, and receives a reference voltage Vref, a high potential driving voltage EVDD, and a low potential driving voltage EVSS from the power supply 500.

The scan line SCL supplies the scan signal SC and a sensing signal to the pixel PXL, and the data line DL supplies the data voltage Vdata to the pixel PXL. In addition, according to various embodiments, the scan line SCL and a sensing line for supplying the sensing signal can be individually connected to the pixel PXL.

In addition, the display panel 100 can include a power line. The plurality of pixels PXL can receive the high-potential driving voltage EVDD and the low-potential driving voltage EVSS via the power line. The display panel 100 can include a reference voltage line RL via which the plurality of pixels PXL can receive the reference voltage Vref.

In addition, each of the pixels PXL includes a light-emitting element and a pixel circuit for driving the light-emitting element. The pixel circuit includes a plurality of switching elements, a driving element, and a capacitor. In this regard, each of the switching element and the driving element can be embodied as a thin-film transistor. In the pixel circuit, the driving element controls an amount of current to be supplied to the light-emitting element based on the data voltage to adjust an amount of light emitted from the light-emitting element. In addition, the switching element transmits the data voltage Vdata and the reference voltage Vref to the driving element and the capacitor in response to the scan signal SC.

The display panel 100 can be embodied as a non-transmissive display panel or a transmissive display panel. The transmissive display panel can be applied to a transparent display device in which an image is displayed on a screen and a real object in the background is visible to a viewer in front of the display device. The display panel 100 can be manufactured as a flexible display panel. The flexible display panel can be embodied as an OLED panel using a plastic substrate.

The pixels PXL can include red, green, and blue pixels for color realization. The pixels PXL can further include a white pixel.

Touch sensors TS can be disposed on the display panel 100. The touch input can be sensed using separate touch sensors or can be sensed using the pixels PXL. The touch sensors can be embodied as in-cell type touch sensors embedded in the display panel 100 or can be disposed on the screen of the display panel in an on-cell type or an add-on type.

The controller 200 receives image information from a host system, processes image data RGB included in the image information to be suitable for a size and resolution of the display panel 100, and supplies the processed image data RGB to the data driver 400. The controller 200 generates a gate control signal GCS and a data control signal DCS using synchronization signals, for example, a clock signal CLK, a data enable signal DE, a horizontal synchronization signal Hsync, and a vertical synchronization signal Vsync as input from an external source. The gate control signal GCS and the data control signal DCS are supplied to the gate driver 300 and the data driver 400, respectively, to control the gate driver 300 and the data driver 400.

The voltage level of the gate control signal GCS output from the controller 200 can be converted into a gate-on voltage and a gate-off voltage via a level shifter and can be supplied to the gate driver 300. The level shifter converts the low level voltage of the gate control signal GCS into the gate low voltage VGL, and converts the high level voltage of the gate control signal GCS into the gate high voltage VGH. The gate control signal GCS includes a start pulse and a shift clock.

The gate driver 300 supplies the scan signal SC to the scan line SCL according to the gate control signal GCS. The gate driver 300 can be disposed on one side or each of both opposing sides of the display panel 100 in a gate in panel (GIP) manner.

The gate driver 300 outputs a scan pulse in response to a start pulse and a shift clock from the controller 200, and sequentially shifts the scan pulse according to the shift clock.

The data driver 400 converts the image data RGB into the data voltage Vdata according to the data control signal DCS, and supplies the converted data voltage Vdata to the pixel PXL via the data line DL.

Although FIG. 1 illustrates that a single data driver 400 is disposed on one side of the display panel 100, the number and arrangement position of the data driver 400 are not limited thereto. For example, the data driver 400 can include a plurality of integrated circuits (IC) which can be disposed on one side of the display panel 100 in an individual manner.

The power supply 500 generates DC power required for driving a pixel array of the display panel 100, the gate driver 300, and the data driver 400. The power supply 500 can include a charge pump, a regulator, a buck converter, a boost converter, etc.

The power supply 500 can receive an input voltage from the host system and can generate the DC voltage such as the gate high voltage VGH, the gate low voltage VGL, the high potential driving voltage EVDD, the low potential driving voltage EVSS, and the reference voltage Vref. The gate low voltage VGL and the gate high voltage VGH can be supplied to the gate driver 300, and the high potential driving voltage EVDD, the low potential driving voltage EVSS, and the reference voltage Vref can be supplied to the pixels PXL.

Figure 2:
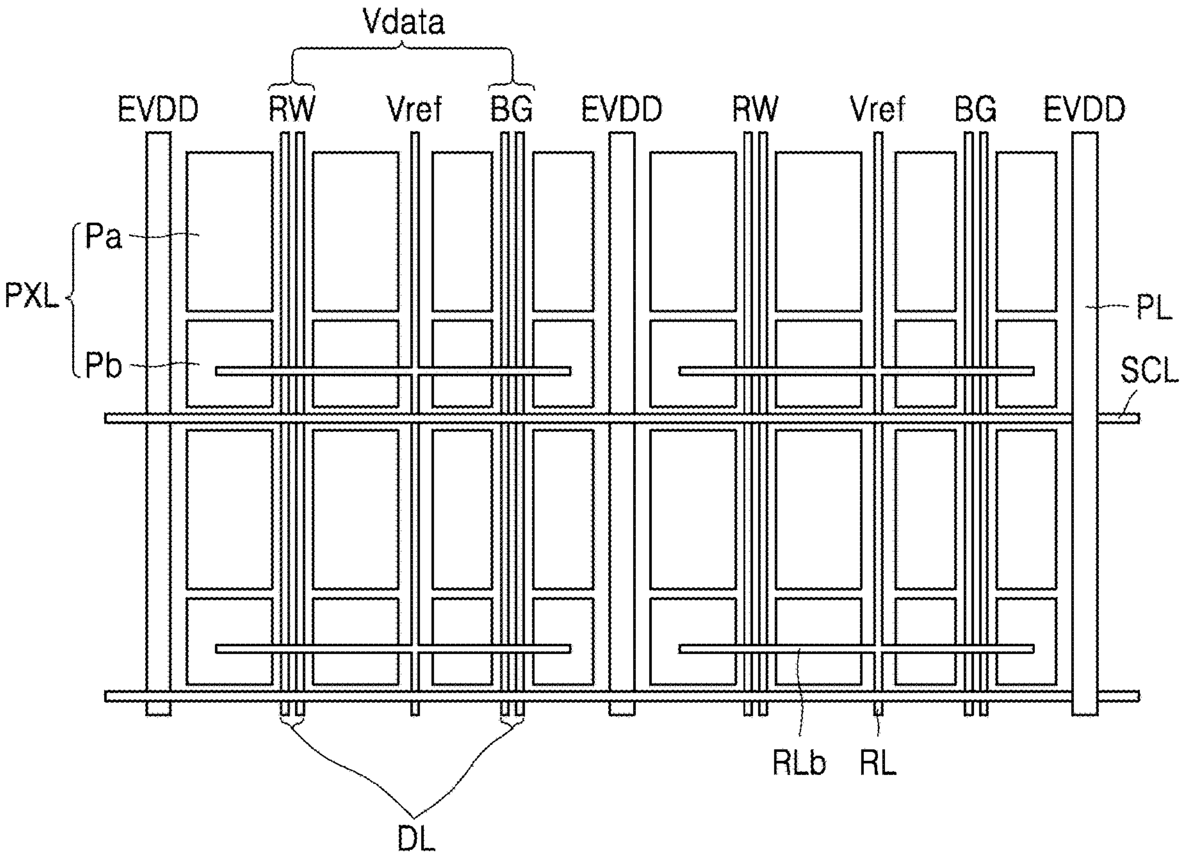
FIG. 2 is a plan view illustrating a pixel structure in an organic light-emitting display device according to embodiments of the present disclosure.

FIG. 2 is a plan view illustrating a pixel structure in an organic light-emitting display device according to embodiments of the present disclosure.

Referring to FIG. 2, an area of the pixel PXL is divided into a light-emitting area Pa and a circuit area Pb. The high potential driving voltage EVDD is supplied to the circuit area Pb via the power line PL, the scan signal is supplied thereto via the scan line SCL, the data voltage Vdata is supplied thereto via the data line DL, and the reference voltage Vref is supplied thereto via the reference voltage line RL and a reference voltage sub-line RLb. Data R, W, B, and G corresponding to the red, white, blue, and green pixels can be supplied thereto.

As application of the organic light-emitting display panel is extended to premium and gaming applications, the demand for high-speed operation as well as high resolution increases. However, many issues arise due to the charge rate and front of screen (FOS) mura in the high-speed operation. In order to improve the specification and secure the characteristics, the line thickness can be increased or the line width can be increased to reduce the line delay. However, this can cause a decrease in the aperture ratio of the light-emitting area Pa.

Figure 3:
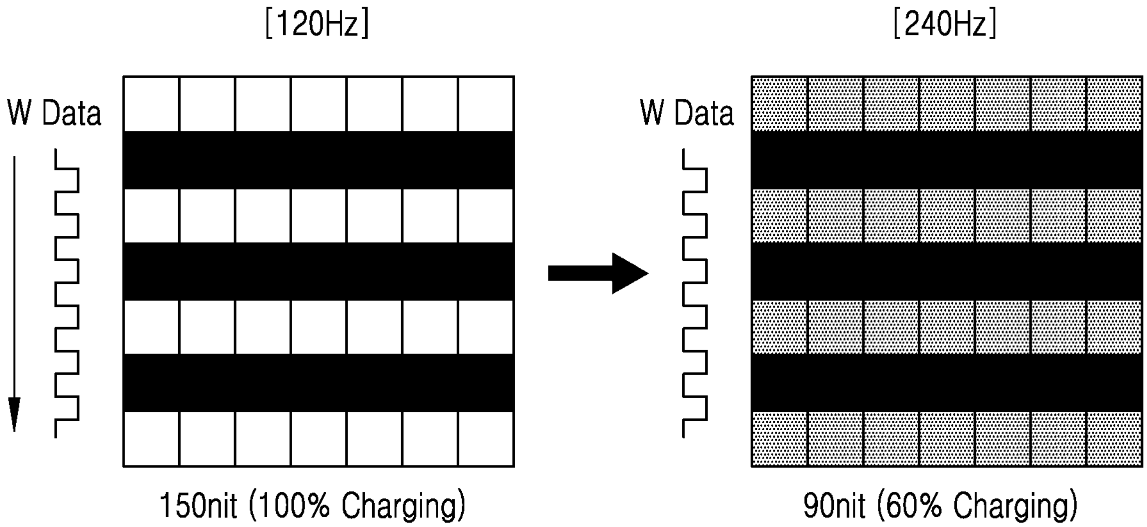
FIG. 3 is a diagram for illustrating charging and luminance issues according to high-speed operation in an organic light-emitting display device according to embodiments of the present disclosure.

FIG. 3 is a diagram for illustrating charging and luminance issues according to high-speed operation in an organic light-emitting display device according to embodiments of the present disclosure.

As shown in FIG. 3, the display device operates to display row stripe patterns of white and black colors. In this regard, when an operation frequency switches from 120 Hz to 240 Hz, charging of the white data W is insufficient due to the reduction of the charging time according to the increase of the operation frequency. This can lead to a charging and luminance disclosure failure.

In the solid pattern, the data waveform is based on direct current (DC), such that there is no delay influence according to the frequency. However, in the row stripe pattern, the data waveform swings on a 1 H basis, such that the target voltage is gradually not charged due to a decrease in 1 H time according to the increase in the operation frequency, resulting in a decrease in luminance. Accordingly, when a measurement pattern capable of measuring the charging rate and luminance of the display panel operating at the increased operation frequency is implemented, the luminance decrease is identified, and an image difference between the column stripe patterns of white and black colors and an image difference between the row stripe patterns of white and black colors can be recognized.

When the operation frequency is increased or the resolution is increased, a reduction in the charging time is inevitable. A purpose of the present disclosure is to secure the charging characteristics of the luminance sum concept by driving the pixels PXL so that data transition is minimized or the data waveform is based on direct current (DC). To this end, the purpose of the present disclosure is intended to improve charging and luminance characteristics even in high-speed operation of 240 Hz by changing the connection structure of the scan lines between the gate driver and the display panel.

Figure 4:
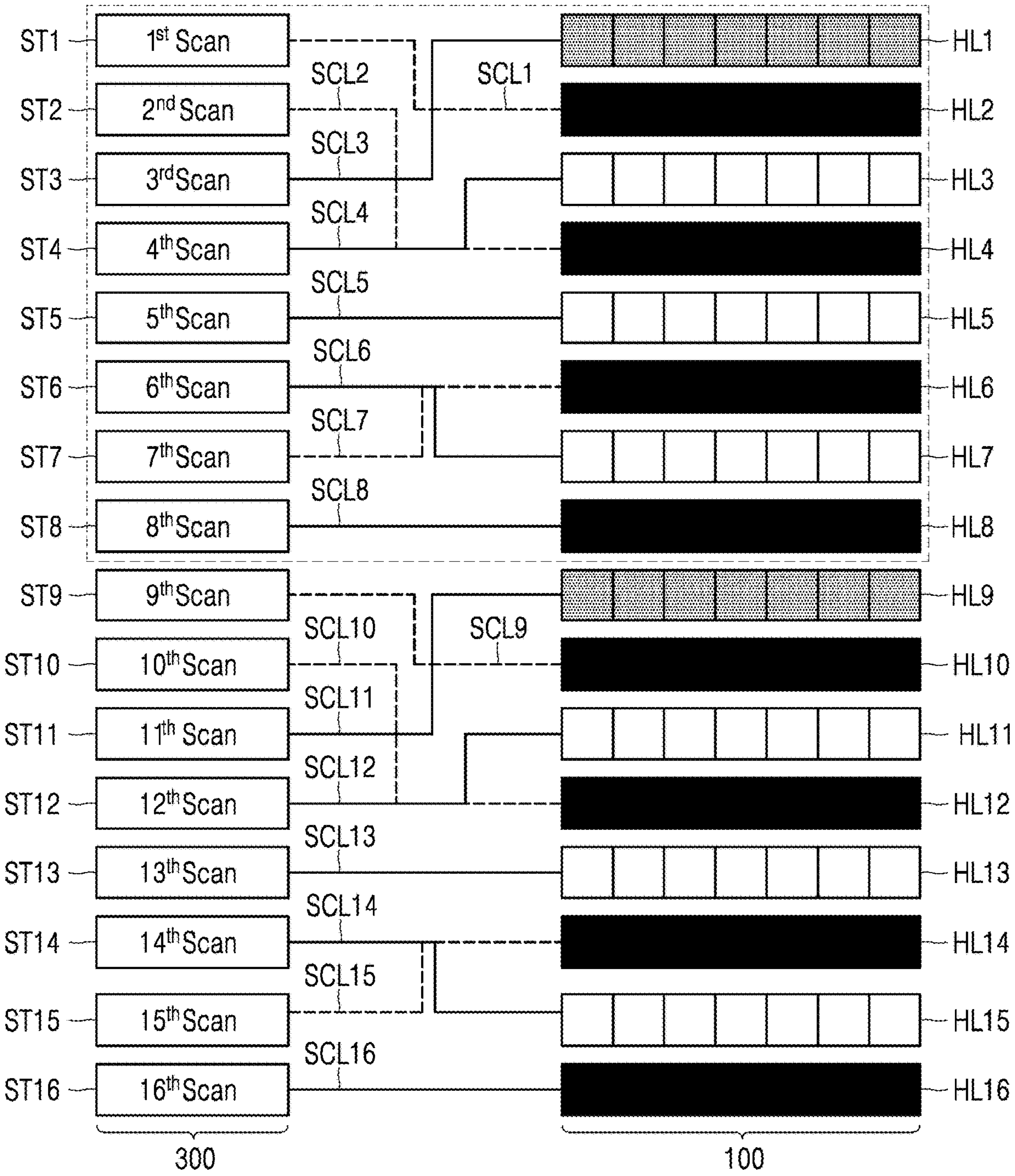
FIG. 4 is a diagram illustrating an arrangement structure of scan lines in an organic light-emitting display device according to embodiments of the present disclosure.

FIG. 4 is a diagram illustrating an arrangement structure of scan lines in an organic light-emitting display device according to embodiments of the present disclosure.

Referring to FIG. 4, the display panel 100 includes first to 16-th horizontal pixel lines HL1 to HL16. Pixels are arranged in a horizontal direction in each of the first to 16th horizontal pixel lines HL1 to HL16.

The gate driver 300 includes first to eighth stage circuits ST1 to ST8 that sequentially supply the first to 8th scan signals 1st Scan to 8th Scan to the display panel 100. The gate driver 300 can be disposed on one side or each of both opposing sides of the display panel 100 in a gate in panel (GIP) manner. The first to eighth stage circuits ST1 to ST8 can sequentially output the first to 8th scan signals 1st Scan to 8th Scan in response to the clock signal or the start signal.

At least two of the scan lines SLL1 to SCL8 intersect each other while being disposed in an area between the gate driver 300 and the display panel 100. At least two of the scan lines SLL1 to SCL8 can intersect each other while being disposed between the first to 8th stage circuits ST1 to ST8 of the gate driver 300 and the first to 8th horizontal pixel lines HL1 to HL8 of the display panel 100. The connection structure of the scan lines in the area between the gate driver 300 and the display panel 100 can minimize the data transition between the horizontal pixel lines or can allow the data waveform to be based on the DC even when the display device operates at high speed to display the row stripe patterns of white and black colors.

For example, the first stage circuit ST1 is connected to the second horizontal pixel line HL2 via the first scan line SCL1, the second stage circuit ST2 is connected to the fourth horizontal pixel line HL4 via the second scan line SCL2, the third stage circuit ST3 is connected to the first horizontal pixel line HL1 via the third scan line SCL3, and the fourth stage circuit ST4 is connected to the third horizontal pixel line HL3 via the fourth scan line SCL4.

The fifth stage circuit ST5 is connected to the fifth horizontal pixel line HL5 via the fifth scan line SCL5, the sixth stage circuit ST6 is connected to the seventh horizontal pixel line HL7 via the sixth scan line SCL6, the seventh stage circuit ST7 is connected to the sixth horizontal pixel line HL6 via the seventh scan line SCL7, and the eighth stage circuit ST8 is connected to the eighth horizontal pixel line HL8 via the eighth scan line SCL8.

The connection structure of the scan lines in the area between the gate driver 300 and the display panel 100 can be repeated in a column direction.

The ninth stage circuit ST9 is connected to the tenth horizontal pixel line HL10 via the first scan line SCL9, the tenth stage circuit ST10 is connected to the eleventh horizontal pixel line HL12 via the tenth scan line SCL10, the eleventh stage circuit ST11 is connected to the ninth horizontal pixel line HL9 via the eleventh scan line SCL11, and the eleventh stage circuit ST12 is connected to the ninth horizontal pixel line HL9 via the eleventh scan line SCL12 11 The horizontal pixel line HL11 is connected.

The 13th stage circuit ST13 is connected to the 13th horizontal pixel line HL13 via the 13th scan line SCL13, the 14th stage circuit ST14 is connected to the 15th horizontal pixel line HL15 via the 14th scan line SCL14, the 15th stage circuit ST15 is connected to the 14th horizontal pixel line HL14 via the 15th scan line SCL15, and the 16th stage circuit SST16 The 16-th horizontal pixel line HL16 is connected to the 16-th horizontal pixel line HL16 via the 16-th scan line SCL16.

As described above, in the display device, the connection structure in which at least two of the plurality of scan lines intersect each other in the area between the plurality of stage circuits and the plurality of horizontal pixel lines is repeated every K pixel horizontal lines in a column direction. Thus, the data transition between the first to 8th horizontal pixel lines HL1 to HL8 can be minimized or the data waveform can be based on the DC even when the display device operates at high speed to display the row stripe patterns of white and black colors. This can enable the display device to operate at a high-speed frequency such as 240 Hz, and can remove the FOS issue which can be caused by the high-speed operation. In one example, K can be 8.

In addition, in the display device, the connection structure in which at least two of the plurality of scan lines intersect each other in the area between the plurality of stage circuits and the plurality of horizontal pixel lines is repeated every K pixel horizontal lines in a column direction, thereby reducing the charging rate degradation and the luminance degradation due to the high-speed operation. In one example, the connection structure in which at least two of the plurality of scan lines SLC1 to SCL8 intersect each other in the area between the plurality of stage circuits ST1 to ST8 and the plurality of horizontal pixel lines HL1 to HL8 is repeated every 8 pixel horizontal lines in a column direction, thereby securing luminance and charging disclosures. This structure makes it possible to secure an average luminance of 90% or greater based on 60% luminance securing.

Figure 5:
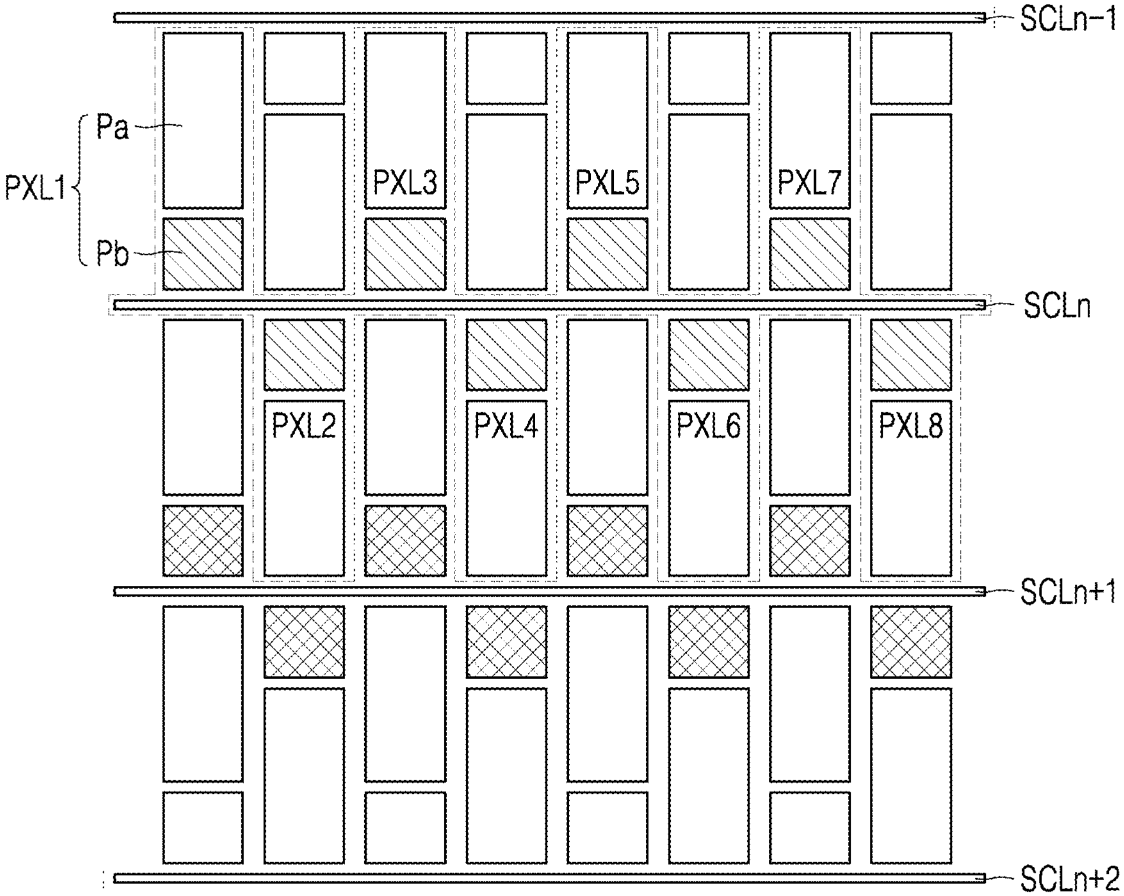
FIG. 5 is a diagram illustrating an arrangement structure of pixels in an organic light-emitting display device according to embodiments of the present disclosure.
Figure 6:
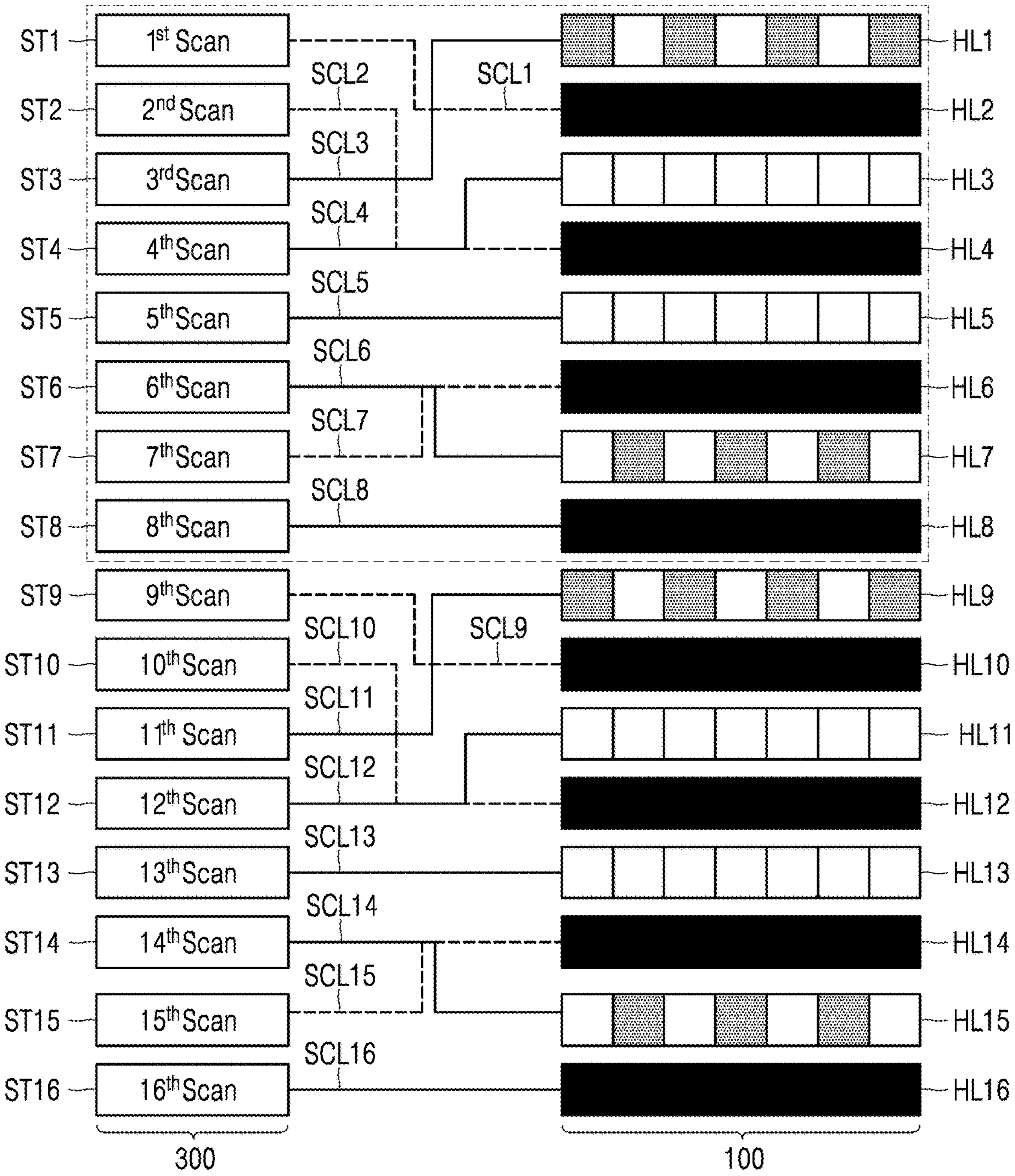
FIG. 6 is a diagram for illustrating mura recognition mitigation according to an arrangement structure of the pixels of FIG. 5.

FIG. 5 is a diagram illustrating an arrangement structure of pixels in an organic light-emitting display device according to embodiments of the present disclosure. FIG. 6 is a diagram for illustrating mura recognition mitigation according to the arrangement structure of the pixels of FIG. 5.

Referring to FIG. 5 and FIG. 6, the scan lines SCLn−1, SCLn, SCLn+1, and SCLn+2 are arranged in the column direction and extend in the row direction. The row array of the pixels PXL can be disposed between adjacent ones of the scan lines SCLn−1, SCLn, SCLn+1, and SCLn+2. In the area between the scan lines SCLn−1 and SCLn+1, the pixels PXL1 to PXL8 can be arranged in the staggered manner in the row direction.

For example, in the area between the scan lines SCLn−1 and SCLn+1, the first pixel PXL1 is disposed on one of both opposing sides in the column direction of the N-th scan line SCLn and at the first column, the second pixel PXL2 is disposed on the other of both opposing sides in the column direction of the N-th scan line SCLn and at the second column, the third pixel PXL3 is disposed on one of both opposing sides in the column direction of the N-th scan line SCLn and at the third column, and the fourth pixel PXL4 is disposed on the other of both opposing sides in the column direction of the N-th scan line SCLn and at the fourth column.

The fifth pixel PXL5 is disposed on one of both opposing sides in the column direction of the N-th scan line SCLn and at the fifth column, the sixth pixel PXL6 is disposed on the other of both opposing sides in the column direction of the N-th scan line SCLn and at the sixth column, the seventh pixel PXL7 is disposed on one of both opposing sides in the column direction of the N-th scan line SCLn and at the seventh column, and the eighth pixel PXL8 is disposed on the other of both opposing sides in the column direction of the N-th scan line SCLn and at the eighth column.

The above staggered arrangement makes it possible to reduce the luminance difference at the boundary to suppress the boundary mura.

Further, the pixel arrangement in the area between the scan lines SCLn−1 and SCLn+1 can be equally applied to the pixel arrangement in the area between the scan lines SCLn and SCLn+2.

As shown in FIG. 6, the structure in which the pixels are arranged in the staggered manner in the row direction such that the odd-numbered pixels are disposed on one of both opposing sides in the column direction of the scan line SL while the even-numbered pixels are disposed on the other of both opposing sides in the column direction of the scan line SL can allow the regularity in the column direction to be lowered to cope with the mura issues in a robust manner from a cognitive perspective. As described above, in the display device, the structure in which the pixels are arranged in the staggered manner in the row direction such that the odd-numbered pixels are disposed on one of both opposing sides in the column direction of the scan line SL while the even-numbered pixels are disposed on the other of both opposing sides in the column direction of the scan line SL can reduce the mura recognition.

The display device according to various aspects and embodiments of the present disclosure can be described as follows.

One aspect of the present disclosure provides a display device comprising: a display panel including: a display area including first to N-th horizontal pixel lines arranged in a column direction and extending in a row direction, wherein a plurality of pixels are arranged in each of the first to N-th horizontal pixel lines; and a non-display area in which a GIP (Gate In Panel) driver circuit is disposed, wherein the GIP driver circuit includes a plurality of stage circuits, wherein the plurality of stage circuits are respectively connected to the first to N-th horizontal pixel lines via a plurality of scan lines, wherein the plurality of scan lines are disposed in an area between the plurality of stage circuits and the first to N-th horizontal pixel lines and are arranged such that at least two of the plurality of scan lines intersect each other, wherein the arrangement of the plurality of scan lines is repeated every K horizontal pixel lines in the column direction.

In accordance with some embodiments, the plurality of stage circuits include first to eighth stage circuits sequentially arranged in the column direction, wherein the plurality of scan lines include first to eighth scan lines sequentially arranged in the column direction, wherein the first to N-th horizontal pixel lines include first to eighth horizontal pixel lines sequentially arranged in the column direction, wherein the first stage circuit is connected to a second horizontal pixel line via the first scan line, the second stage circuit is connected to the fourth horizontal pixel line via the second scan line, the third stage circuit is connected to the first horizontal pixel line via the third scan line, and the fourth stage circuit is connected to the third horizontal pixel line via the fourth scan line, wherein the fifth stage circuit is connected to the fifth horizontal pixel line via the fifth scan line, the sixth stage circuit is connected to the seventh horizontal pixel line via the sixth scan line, the seventh stage circuit is connected to the seventh horizontal pixel line via the seventh scan line, and the eighth stage circuit is connected to the eighth horizontal pixel line via the eighth scan line.

In accordance with some embodiments of the present disclosure, K is 8.

In accordance with some embodiment, the plurality of scan lines include (n−1)-th, n-th, and (n+1)th scan lines sequentially arranged in the column direction, wherein in an area between the (n−1)-th and (n+1)th scan lines, the plurality of pixels are arranged in a staggered manner in the row direction such that odd-numbered pixels are disposed on one of both opposing sides in the column direction of the n-th scan line while even-numbered pixels are disposed on the other of both opposing sides in the column direction of the n-th scan line.

In accordance with some embodiments, the plurality of pixels include first to fourth pixels arraigned in the row direction, wherein in the area between the (n−1)-th and (n+1)th scan lines, a first pixel at a first column is disposed on one of both opposing sides in the column direction of the n-th scan line while a second pixel at a second column are disposed on the other of both opposing sides in the column direction of the n-th scan line.

In accordance with some embodiments, in the area between the (n−1)-th and(n+1)th scan lines, a third pixel at a third column is disposed on one of both opposing sides in the column direction of the n-th scan line while a fourth pixel at a fourth column are disposed on the other of both opposing sides in the column direction of the n-th scan line.

In accordance with some embodiments, the plurality of scan lines disposed in the area between the plurality of stage circuits and the first to N-th horizontal pixel lines are arranged such that at least two of the plurality of scan lines intersect each other, such that when the display device displays a pattern in which the horizontal pixel lines corresponding to white color and the horizontal pixel lines corresponding to a black color are repeatedly arranged alternately with each other, data transition between the first to N-th horizontal pixel lines is minimized.

Although some embodiments of the present disclosure have been described above with reference to the accompanying drawings, the present disclosure may not be limited to some embodiments and can be implemented in various different forms. Those of ordinary skill in the technical field to which the present disclosure belongs will be able to appreciate that the present disclosure can be implemented in other specific forms without changing the technical idea or essential features of the present disclosure. Therefore, it should be understood that some embodiments as described above are not restrictive but illustrative in all respects.

What is claimed is:

1. A display device comprising:

a display panel including:

a display area including first to N-th horizontal pixel lines arranged in a first direction and extending in a second direction, wherein a plurality of pixels are arranged in each of the first to N-th horizontal pixel lines; and a non-display area in which a gate in panel (GIP) driver circuit is disposed, wherein the GIP driver circuit includes a plurality of stage circuits, and the plurality of stage circuits are respectively connected to the first to N-th horizontal pixel lines via a plurality of scan lines, wherein the plurality of scan lines are disposed in an area between the plurality of stage circuits and the first to N-th horizontal pixel lines, and are arranged so that at least two non-consecutive scan lines of the plurality of scan lines intersect each other, and wherein the arrangement of the plurality of scan lines is repeated every K horizontal pixel lines in the first direction.

2. The display device of claim 1, wherein the plurality of stage circuits include first to eighth stage circuits sequentially arranged in the first direction, wherein the plurality of scan lines include first to eighth scan lines sequentially arranged in the first direction, and wherein the first to N-th horizontal pixel lines include first to eighth horizontal pixel lines sequentially arranged in the first direction.

3. The display device of claim 2, wherein the first stage circuit is connected to a second horizontal pixel line via the first scan line, wherein the second stage circuit is connected to the fourth horizontal pixel line via the second scan line, wherein the third stage circuit is connected to the first horizontal pixel line via the third scan line, and wherein the fourth stage circuit is connected to the third horizontal pixel line via the fourth scan line.

4. The display device of claim 3, wherein the fifth stage circuit is connected to the fifth horizontal pixel line via the fifth scan line, wherein the sixth stage circuit is connected to the seventh horizontal pixel line via the sixth scan line, wherein the seventh stage circuit is connected to the seventh horizontal pixel line via the seventh scan line, and wherein the eighth stage circuit is connected to the eighth horizontal pixel line via the eighth scan line.

5. The display device of claim 1, wherein K is 8.

6. The display device of claim 1, wherein the plurality of scan lines include (n−1)-th, n-th, and (n+1)th scan lines sequentially arranged in the first direction, and wherein in an area between the (n−1)-th and (n+1)th scan lines, the plurality of pixels are arranged in a staggered manner in the second direction so that odd-numbered pixels are disposed on one of opposing sides in the first direction of the n-th scan line while even-numbered pixels are disposed on the other of the opposing sides in the first direction of the n-th scan line.

7. The display device of claim 6, wherein the plurality of pixels include first to fourth pixels arraigned in the second direction, and wherein in the area between the (n−1)-th and (n+1)th scan lines, a first pixel at a first column is disposed on one of opposing sides in the first direction of the n-th scan line while a second pixel at a second column are disposed on the other of the opposing sides in the first direction of the n-th scan line.

8. The display device of claim 7, wherein in the area between the (n−1)-th and (n+1) th scan lines, a third pixel at a third column is disposed on one of opposing sides in the first direction of the n-th scan line while a fourth pixel at a fourth column are disposed on the other of the opposing sides in the first direction of the n-th scan line.

9. The display device of claim 1, wherein the plurality of scan lines disposed in the area between the plurality of stage circuits and the first to N-th horizontal pixel lines are arranged and at least two of the plurality of scan lines intersect each other, so that when the display device displays a pattern in which the horizontal pixel lines corresponding to white color and the horizontal pixel lines corresponding to a black color are repeatedly arranged alternately with each other, data transition between the first to N-th horizontal pixel lines is minimized.

10. The display device of claim 1, wherein the first direction is a column direction, and the second direction is a row direction.

* * * * *